United States Patent [19]

Hansen, Jr.

[11] 4,250,379
[45] Feb. 10, 1981

[54] SAFETY SELECTOR SWITCH

[75] Inventor: James D. Hansen, Jr., Bothell, Wash.

[73] Assignee: The United States of America as represented by the Secretary of the Navy, Washington, D.C.

[21] Appl. No.: 68,789

[22] Filed: Aug. 22, 1979

[51] Int. Cl.³ .......................... G01D 5/34; G05G 1/08
[52] U.S. Cl. ..................... 250/229; 74/504; 74/526
[58] Field of Search ............ 250/229; 340/365 P; 74/504, 526, 548, 565

[56] References Cited

U.S. PATENT DOCUMENTS

| | | | |
|---|---|---|---|
| 2,912,880 | 11/1959 | Biggs et al. | 74/526 |
| 3,067,629 | 12/1962 | Zurles | 74/504 |
| 3,107,546 | 10/1963 | Rowland | 74/526 |
| 3,139,769 | 7/1964 | Gauchat | 74/565 |

Primary Examiner—David C. Nelms
Assistant Examiner—Edward P. Westin

[57] ABSTRACT

A safety selector switch for preventing accidental energization of an electrical circuit. A plurality of annular discs, each having a cut-out portion in its periphery, are mounted on a shaft of an electrical component, such as a rotary switch. A second shaft is provided which is translatable in a direction parallel to the longitudinal axis of the shaft of the electrical component, and an arm is provided on said second shaft and is selectively positionable in each cut-out portion of said annular discs to limit rotation of the shaft of the electrical component. Continued rotation of the shaft of the electrical component can only be made by alternately rotating said shaft of said electrical component and translating said second shaft to move said arm to a cut-out portion of an adjacent annular disc.

8 Claims, 16 Drawing Figures

SAFETY SELECTOR SWITCH

BACKGROUND OF THE INVENTION

The present invention relates to a safety selector switch for preventing accidental energization of an electrical circuit by requiring a very definite sequence of operations in order to rotate an electrical device, such as a rotary switch, to its various positions.

Control panels, such as those used in aircraft, often have large numbers of electrical components such as switches and potentiometers, and because of space limitations these components are often mounted closely together. Consequently, it is very likely that a component may be unintentionally rotated when it should not be, which could create an unsafe condition.

Various locking devices have been provided to prevent accidental rotation of a rotary device. One well-known device is described in U.S. Pat. No. 2,917,942, "Rotary Locking Device", which issued Dec. 22, 1959, to John W. Jarrett and Everett L. Rice. This patented device comprises a shaft that is axially slidably attached to the existing shaft of an electrical component, and the attached shaft has at least one lug that is engageable with a plurality of slots in a shaft bushing. The attached shaft is resiliently biased outwardly to retain the lugs within one of the slots and when in this position, the attached shaft is locked from rotation. When it is desired to rotate the attached shaft, it is first necessary to move it inwardly until the lug is disengaged from the slot. The shaft is then free to be rotated. However, the disadvantage of this patented device resides in the face that once the attached shaft is moved inwardly, then the shaft is free to be rotated to any angular position and thus the shaft can be accidentally rotated to a position that would create an unsafe condition. For example, in a bomb arming system it may be necessary to turn a shaft to several warm-up positions, or test positions, before turning to an arming position and no heretofore known device can provide the necessary safety function of permitting rotation to a plurality of positions and providing locking means for each position.

Another safety locking device for a rotary switch is described in U.S. Pat. No. 3,139,769, entitled "Rotary Locking Device", which issued July 7, 1964, to Richard H. Gauchat. In this patented device, a housing is attached to the threaded portion of a rotary switch and a shaft carried by the housing is axially slidably attached to the existing shaft of a rotary switch. A pair of locking pins are provided on the attached shaft and these pins are engageable with a locking plate which limits the amount of rotational travel of the attached shaft. In order to obtain additional rotation, the pins must be shifted axially, that is, an alternating push-pull motion is required in order to turn the attached shaft to its various positions. Thus, accidental rotation can be avoided, as a very definite sequence of operation is required in order to turn a rotary switch to its various positions.

SUMMARY OF THE INVENTION

The present invention relates to a safety selector switch for preventing accidental energization of an electrical circuit such as a weapon arming circuit in a military aircraft. A plurality of annular discs, each having a cut-out portion in its periphery, are mounted on a shaft of an electrical component, such as a rotary switch. A second shaft is provided which is translatable in a direction parallel to the longitudinal axis of the shaft of the electrical component, and an arm is provided on said second shaft and is selectively positionable in each cut-out portion of said annular discs to limit rotation of the shaft of the electrical component.

After the shaft of the electrical component has been turned a partial revolution, the arm on the second shaft reaches the end of the cut-out portion and is prevented from further rotation. The second shaft is then translated so that the arm thereon enters the cut-out portion in an adjacent annular disc and the shaft of the electrical component can again be rotated.

A first light source and a first light detector are attached on opposite sides of the selector switch housing and one disc has a through aperture which permits light to pass from said light source to said light detector when the one disc is in a predetermined position. A second light source and a second light detector are also attached on opposite sides of the housing and a shutter is provided on the second shaft to block passage of light from the second light source to the second light detector until the second shaft is moved outwardly to its most forward position. When both light detectors receive signals, the function of the final switch position is achieved.

It is therefore a general object of the present invention to provide a safety mechanism to an electrical component which will prevent accidental energization of an electrical circuit.

Another object of the present invention is to provide a sequence of operations in order to rotate a shaft of an electrical component.

Still another object of the present invention is to provide light emitters and light detectors to assure that a proper sequence of operations has been performed to rotate a shaft of an electrical component to a final energizing position.

DESCRIPTION OF THE PREFERRED EMBODIMENT

Figure 1:
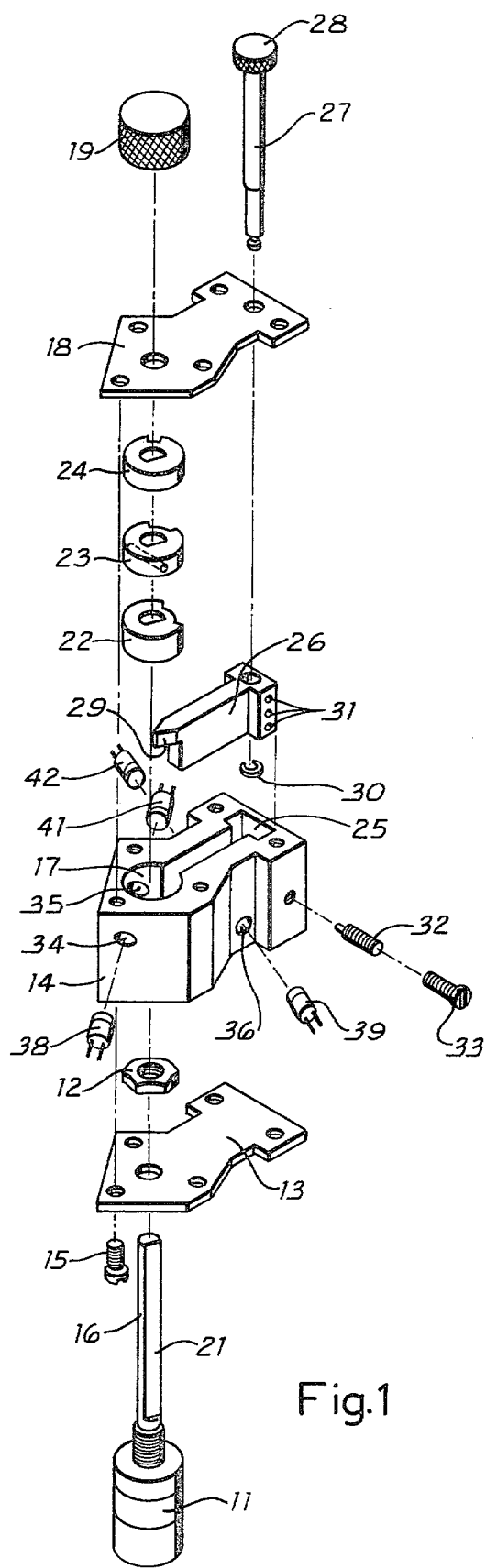
FIG. 1 is an exploded view of a preferred embodiment of the present invention.
Figure 2:
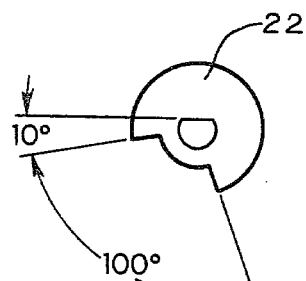
FIG. 2 is a top plan view of a first stop plate.
Figure 3:
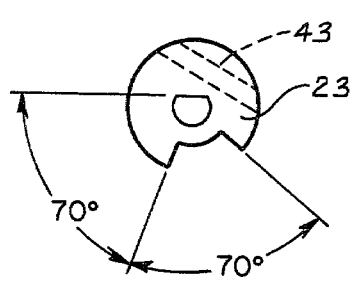
FIG. 3 is a top plan view of a second stop plate.
Figure 4:
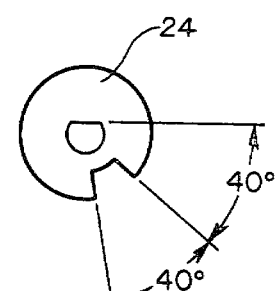
FIG. 4 is a top plan view of a third stop plate.

Referring now to FIG. 1 of the drawings, an electrical component 11, such as a rotary switch, is attached by a nut 12 to a first cover plate 13 which, in turn, is connected to a housing 14 by screws 15. Component 11 has a shaft 16 which extends through an opening 17 in housing 14 and through a second cover plate 18. A knob 19 is provided on the end of shaft 16 to operate the electrical component by turning shaft 16. Shaft 16 is provided with a flat surface 21 thereon, and three stop plates 22, 23 and 24 are positioned on shaft 16. Each stop plate has an aperture with a flat surface which prevents relative rotation between the stop plates and shaft 16. Housing 14 is provided with a through T-slot 25 which connects with opening 17 in housing 14.

A translational shutter 26, which is also T-shaped, is slidably mounted in T-slot 25 and a shaft 27, having a knob 28 thereon, is attached to shutter 26 to move shutter 26 in T-slot 25. Shutter 26 has an arm 29 which extends into opening 17 in housing 14. Shutter 26 is provided with indentations 31 which are engaged by a spring detent mechanism 32 to hold shutter 26 in its various positions.

Housing 14 has two pairs of aligned holes 34, 35, and 36, 37. Holes 34 and 35 communicate with opening 17 and holds 36 and 37 communicate with T-slot 25. Light emitting diodes 38 and 39 are mounted opposite holes 34 and 36 and light detecting diodes 41 and 42 are mounted opposite holes 35 and 37. Stop plate 23 is in alignment with the first pair of holes 34 and 35 and a through hole 43 is provided through a chord of stop plate 23. As best shown in FIG. 7(b) of the drawings, light from diode 38 can pass through hole 43 to light detecting diode 41 when shaft 16 of rotary switch 11 has been turned to a final position.

Figure 7A:
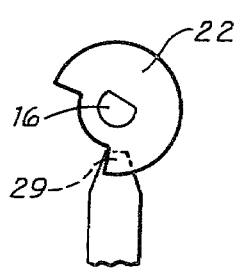
FIGS. 7(a), 7(b), and 7(c) are diagrammatic views showing stop plates in a third position.
Figure 7B:
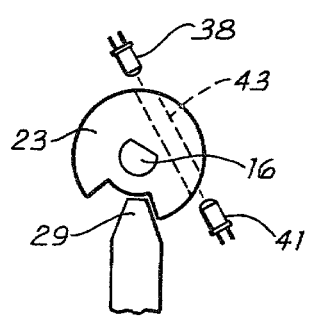
Figure 7C:
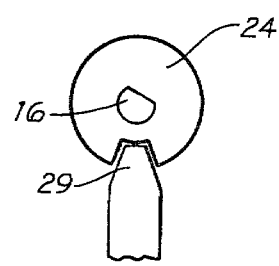
Figure 8:
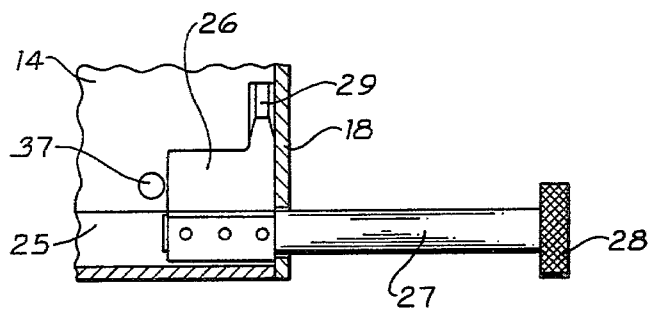
FIG. 8 is a side view of a shutter and stop arm.

Referring now to FIG. 8 of the drawings, it can be seen that when shaft 16 of rotary switch 11 has been turned to a final position (as illustrated by FIGS. 7(a), 7(b), and 7(c)), shutter 26 can be moved to its final position by pulling on knob 28 which is attached to shaft 27, and, in this final position, light from diode 39 can pass through holes 36 and 37 to diode 42.

Figure 9:
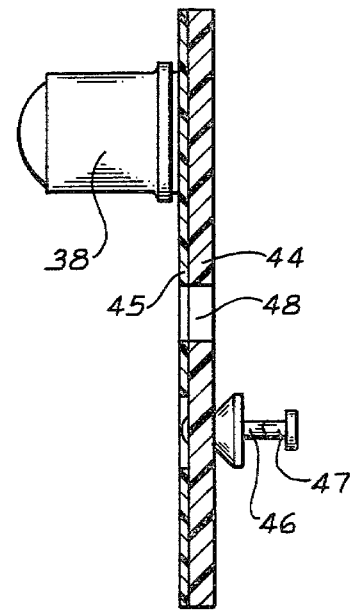
FIG. 9 is a circuit diagram showing light emitters and light receivers.

In FIG. 1 of the drawings, diodes 38, 39 41 and 42 are shown positioned adjacent to holes 34, 36, 35, and 37, respectively, and FIG. 9 of the drawings shows one method of securing the diodes to housing 14. A printed circuit board 44 and spacer 45 are provided, and a diode is soldered to board 44. A pair of terminals 46 and 47 are mounted on printed circuit board 44 to facilitate connecting to an external circuit. Preferably, all four diodes 38, 39, 41 and 42 are mounted on identical printed circuit boards and can be attached to housing 14 by means of a screw through hole 48 in board 44.

Figure 10:
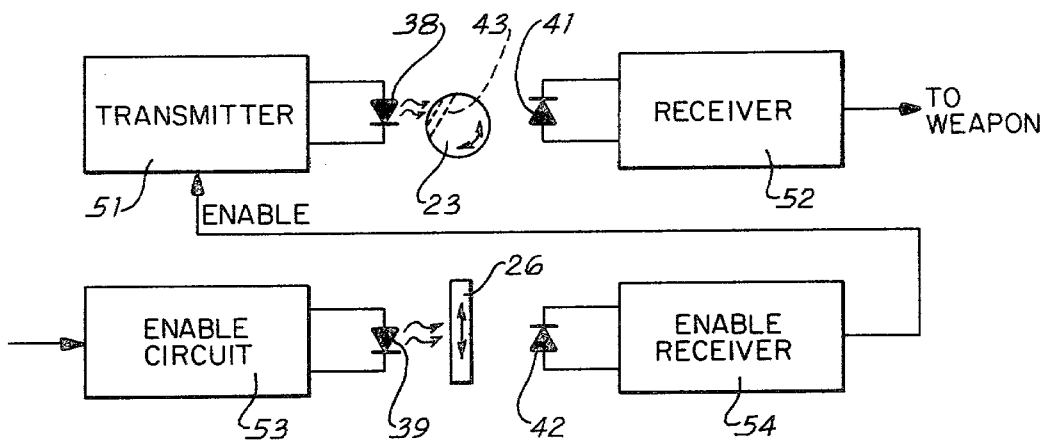
FIG. 10 is a circuit diagram showing use of diodes.

Referring now to FIG. 10 of the drawings, the function of the diodes can readily be seen. A connection between transmitter 51 and receiver 52 cannot be made until stop plate 23 is rotated to its final position whereby hole 43 becomes aligned with diodes 38 and 41 and light can pass through hole 43 in stop plate 23. However, diode 38 is off because an enabling signal has not been received by transmitter 51 because shutter 26 has not been moved and light cannot pass from diode 39 to diode 42. As best shown in FIGS. 7(b) and 7(c), however, when hole 43 is aligned with diodes 38 and 41, arm 43 is in position to be moved to its final position, and upon movement, shutter 26 clears the passage between holes 36 and 37 and light can pass from diode 39 to diode 42. A signal then passes from enable circuit 53 to receiver 54 which, in turn passes a signal to transmitter 51 and then to receiver 52.

OPERATION

By way of example, rotary switch 11 might be a four position switch and, in one military application, these positions were designated as "OFF", "MONITOR", "SAFE", and "ARMED". The operation of the present invention will now be described using these designations.

Figure 5A:
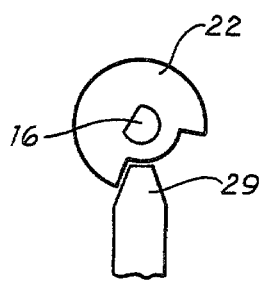
FIGS. 5(a), 5(b), and 5(c) are diagrammatic views showing stop plates in a first position.
Figure 5B:
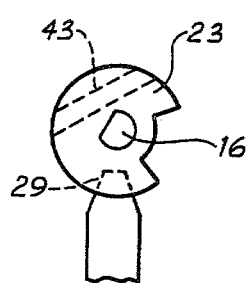
Figure 5C:
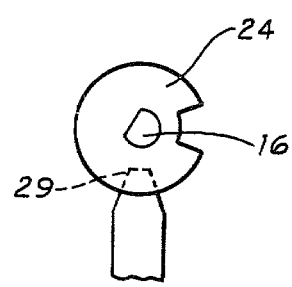

Referring to FIGS 5, 6, and 7 of the drawings, FIG. 5(a) shows the positions of stop plate 22 and arm 29 when rotary switch 11 is in the "OFF" position. From this "OFF" position, switch 11 can then be turned to "MONITOR" and then directly to "SAFE" by turning knob 19 in a clockwise direction. Likewise, the switch can be turned to "MONITOR" and then back to "OFF" by merely turning knob 19 in the proper directions. As shown in FIG. 5(b), arm 29 must stay positioned in the cut-out portion of stop plate 22 as stop plate 23 prevents any outward movement of arm 29 by a force applied to shaft 27.

Figure 6A:
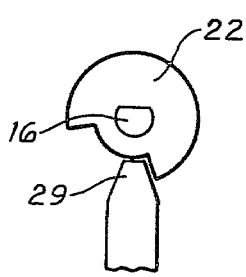
FIGS. 6(a), 6(b), and 6(c) are diagrammatic views showing stop plates in a second position.
Figure 6B:
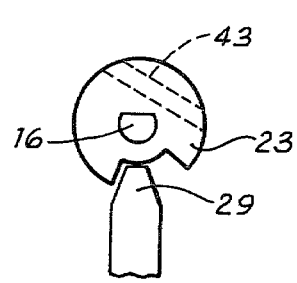
Figure 6C:
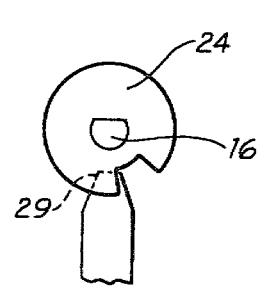

FIG. 6(a) shows the position of stop plate 22 and arm 29 when rotary switch 11 has been turned on the "SAFE" position. It can be seen that shaft 16 cannot be turned any further in a clockwise position, as arm 29 is positioned as one end of the cut-out. As previously stated, shaft 16 could be turned in a counterclockwise direction to return switch 11 to either a "MONITOR" or "OFF" position. FIG. 6(b) shows that arm 29 is aligned with the cut-out in stop plate 23 and, by pulling outwardly on knob 28 which is attached to shaft 27, arm 29 is moved from being aligned with stop plate 22 to now being aligned with stop plate 23. As shown in FIG. 6(c) the outward movement of arm 29 is limited by stop plate 24, and arm 29 can thus be moved only one position, that is, from alignment with stop plate 22 to alignment with stop plate 23. When arm 29 is moved into the cut-out portion of stop plate 23, rotary switch 11 can then be turned in a clockwise position to the "ARMED" position, which is shown in FIG. 7(b). When stop plate 23 reaches the position shown in FIG. 7(b), further clockwise rotation is prevented and hole 43 in stop plate 23 provides a light passage between diodes 38 and 41.

Referring now to FIG. 10 of the drawings, although stop plate 23 has been rotated to align hole 43 with diodes 38 and 41, diode 38 does not emit as the circuit is still not complete. As shown in FIG. 7(c) arm 29 is now aligned with the cut-out in stop plate 24 and arm 29 can be moved outwardly from alignment with stop plate 23 and into alignment with stop plate 24. As best shown in FIG. 8 of the drawings, when arm 29 is moved into alignment with stop plate 24, shutter 26 clears holes 36 and 37 and light can pass from diode 39 to diode 42.

It can thus be seen that going from an "OFF" position of rotary switch 11 to an "ARMED" position requires four separate operations, that is, rotation of knob 19, translation of knob 28, rotation of knob 19, and, finally, translation of knob 28. As this operation involves the sequential turning of one knob, followed by the pulling of a different knob, with the sequence then being repeated, it can be seen that the accidental arming of a weapon is not likely to occur.

While the operation of present invention has been described in relation with a particular arming switch, the present selector switch can have use with any device where inadvertent switching is to be avoided.

Obviously many modifications and variations of the present invention are possible in the light of the above teachings. It is therefore to be understood that the invention may be practiced otherwise than as specifically described.

I claim:

1. A locking device for an electrical component comprising, a housing attached to a rotatable shaft of an electrical component, a plurality of stop plates mounted on said rotatable shaft within said housing, each said stop plate having a cut-out portion in its periphery, a second shaft slidably attached in said housing having an arm selectively positionable in said cut-out portions of said stop plates to limit rotation of said rotatable shaft, said cut-out portions in each stop plate being arranged to permit successive translations of said arm into cut-outs of adjacent stop plates after each stop plate has been rotated to a predetermined position, light emitting means and light detecting means attached to said housing, and means within said housing for selectively blocking and passing light from said light emitting means to said light detecting means.

2. A locking device for an electrical component as set forth in claim 1 wherein one of said stop plates has a through aperture whereby light from said light emitting means passes through said aperture to said light detecting means when said stop plate having said through aperture is rotated to a predetermined position.

3. A locking device for an electrical component as set forth in claim 1 wherein said means within said housing for selectively blocking and passing light from said light emitting means to said light detecting means comprises a shutter attached to said second shaft for blocking passage of light from said light emitting means to said light detecting means until said second shaft is moved to a predetermined position.

4. A locking device for an electrical component as set forth in claim 1 wherein said light emitting means and said light detecting means includes first and second light sources attached to said housing and first and second light detectors attached opposite said light sources and wherein one of said stop plates has a through aperture wherein light from said first light source passes through said aperture to said first light detector when said stop plate having said through aperture is rotated to a predetermined position, and wherein said means within said housing for selectively blocking and passing light includes a shutter attached to said second shaft for blocking passage of light from said second light source to said second light detector until said second shaft is moved to a predetermined position.

5. A locking device for a rotary switch comprising, a housing attached to a rotatable shaft of a rotary switch, at least three annular stop plates mounted on said rotatable shaft within said housing, each said stop plate having a cut-out portion in its periphery, a second shaft slidably attached in said housing and movable in a direction parallel to the longitudinal axis of said rotatable shaft and having an arm selectively positionable in said cut-out portions of said stop plates to limit rotation of said rotatable shaft, said cut-out portions in each stop plate being arranged to permit successive translations of said arm into cut-outs of adjacent stop plates after each stop plate has been rotated to a predetermined position, light emitting means and light detecting means attached to said housing, and means within said housing for selectively blocking and passing light from said light emitting means to said light detecting means.

6. A locking device for a rotary switch as set forth in claim 5 wherein one of said stop plates has a through aperture whereby light from said light emitting means passes through said aperture to said light detecting means when said stop plate having said through aperture is rotated to a predetermined position.

7. A locking device for a rotary switch as set forth in claim 5 wherein said means within said housing for selectively blocking and passing light from said light emitting means to said light detecting means comprises a shutter attached to said second shaft for blocking passage of light from said light emitting means to said light detecting means until said second shaft is moved to a predetermined position.

8. A locking device for a rotary switch as set forth in claim 5 wherein said light emitting means and said light detecting means includes first and second light sources attached to said housing and first and second light detectors attached opposite said light sources and wherein one of said stop plates has a through aperture wherein light from said light source passes through said aperture to said first light detector when said stop plate having said through aperture is rotated to a predetermined position, and wherein said means within said housing for selectively blocking and passing light includes a shutter attached to said second shaft for blocking passage of light from said second light source to said second light detector until said second shaft is moved to a predetermined position.

\* \* \* \* \*